(12) United States Patent
Balakrishnan et al.

(10) Patent No.: US 6,249,876 B1
(45) Date of Patent: Jun. 19, 2001

(54) FREQUENCY JITTERING CONTROL FOR VARYING THE SWITCHING FREQUENCY OF A POWER SUPPLY

(75) Inventors: Balu Balakrishnan; Alex Djenguerian, both of Saratoga; Leif Lund, San Jose, all of CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 09/192,959

(22) Filed: Nov. 16, 1998

(51) Int. Cl.[7] .................................................. G06F 1/04
(52) U.S. Cl. ......................... 713/501; 713/300; 713/503
(58) Field of Search .................................. 713/300, 320, 713/322, 500, 501, 503

(56) References Cited

U.S. PATENT DOCUMENTS

| | | | |
|---|---|---|---|
| 4,712,169 | * 12/1987 | Albach | 363/89 |
| 4,930,063 | * 5/1990 | Henze et al. | 363/91 |
| 5,459,392 | * 10/1995 | Mandelcorn | 323/222 |
| 6,107,851 | * 8/2000 | Balakrishnan et al. | 327/172 |

OTHER PUBLICATIONS

Ashok Bindra, "Power–Conversion Chip Cuts Energy Wastage in Off–Line Switchers," *Electronic Design*, pp. 46,48, Oct. 1998.

* cited by examiner

*Primary Examiner*—Dennis M. Butler
(74) *Attorney, Agent, or Firm*—Blakely, Sokoloff, Taylor & Zafman, LLP.

(57) ABSTRACT

EMI emission is reduced by jittering the switching frequency of a switched mode power supply. An oscillator with a control input for varying the oscillator's switching frequency generates a jittered clock signal. In one embodiment, the oscillator is connected to a counter clocked by the oscillator. The counter drives a digital to analog converter, whose output is connected to the control input of the oscillator for varying the oscillation frequency. In another embodiment, the oscillator is connected to a low frequency oscillator whose low frequency output is used to supplement the output of the oscillator for jittering the switching frequency. The invention thus deviates or jitters the switching frequency of the switched mode power supply oscillator within a narrow range to reduce EMI noise by spreading the energy over a wider frequency range than the bandwidth measured by the EMI test equipment.

32 Claims, 6 Drawing Sheets

FREQUENCY JITTERING CONTROL FOR VARYING THE SWITCHING FREQUENCY OF A POWER SUPPLY

BACKGROUND

The present invention relates to an off-line switched mode control system with frequency jittering.

Many products rely on advanced electronic components to cost-effectively provide the product with the desired functionality. These electronic components require power regulation circuitry to supply them with a clean and steady source of power. The development of switched mode power supply technology has led to power supplies operating at high frequency to achieve small size and high efficiency. Each switched mode power supply typically relies on an oscillator switching at a fixed switching frequency or alternatively a variable frequency (such as in a ringing choke power supply).

Due to the high frequency operation relative to the frequency of an alternating current (AC) power line, switched mode power supplies can exacerbate problems associated with electromagnetic interference (EMI). EMI noise is generated when voltage and current are modulated by the switching power supply. This electrical noise can be transferred to the AC power line.

In addition to affecting the operation of other electronics within the vicinity of the power supply by conduction, EMI induced noise on a power line may radiate or leak from the power line and affect equipment which is not even connected to the power line. Both conducted and radiated electrical noise may adversely affect or interfere with the operation of the electronic equipment. For example, EMI noise generated by the switching power supply can cause problems for communication devices in the vicinity of the power supply. Radiated high frequency noise components may become a part of the AC mains signal and may be provided to other devices in the power grid. Further, power supply radiated EMI can interfere with radio and television transmissions.

To address EMI related interference, several specifications have been developed by government agencies in the United States and in the European Community. These agencies have established specifications that define the maximum amount of EMI that can be produced by various classes of electronic devices. Since power supplies generate a major component of the EMI for electronic devices, an important step in designing such supplies that conform to the specifications is to minimize EMI emission to the acceptable limits of the various specifications.

EMI may be reduced in a power supply by adding snubbers and input filters. These components reduce the noise transferred to the power line and by so doing, also reduce the electric and magnetic fields of noise generated by the power line. While these methods can reduce EMI, they usually complicate the design process as well as increase the production cost. In practice, noise filtering components are added in an ad hoc manner and on a trial-and-error basis during the final design process when EMI is found to exceed the compliance limits specified by the regulatory agencies. This inevitably adds unexpected costs to the products.

Further, extra components can undesirably increase the size and weight of the power supply and thus the resulting product.

SUMMARY OF THE INVENTION

EMI emission is reduced by jittering the switching frequency of a switched mode power supply. In one aspect, a frequency jittering circuit varies the switching frequency using an oscillator for generating a switching frequency signal, the oscillator having a control input for varying the switching frequency. A digital to analog converter is connected to the control input for varying the switching frequency, and a counter is connected to the output of the oscillator and to the digital to analog converter. The counter causes the digital to analog converter to adjust the control input and to vary the switching frequency.

Implementations of the invention include one or more of the following. The oscillator has a primary current source connected to the oscillator control input. A differential switch may be used with first and second transistors connected to the primary current source; a third transistor connected to the first transistor; and a fourth transistor connected to the second transistor at a junction. A capacitor and one or more comparators may be connected to the junction. The digital to analog converter has one or more current sources, with a transistor connected to each current source and to the counter. The primary current source may generate a current I and each of the current sources may generate a current lower than I. The current sources may generate binary weighted currents. The largest current source may generate a current which is less than about 0.1 of I.

In a second aspect, a method for generating a switching frequency in a power conversion system includes generating a primary current; cycling one or more secondary current sources to generate a secondary current which varies over time; and supplying the primary and secondary currents to a control input of an oscillator for generating a switching frequency which is varied over time.

Implementations of the invention include one or more of the following. A counter may be clocked with the output of the oscillator. The primary current may be generated by a current source. If the primary current is I, each of the secondary current sources may generate a supplemental current lower than I and which is passed to the oscillator control input. The supplemental current may be binary-weighted. The largest supplemental current may be less than approximately 0.1 of I.

In another aspect, a method for generating a switching frequency in a power conversion system includes generating a primary voltage; cycling one or more secondary voltage sources to generate a secondary voltage which varies over time; and supplying the primary and secondary voltages to a control input of a voltage-controlled oscillator for generating a switching frequency which is varied over time.

Implementations of the invention include one or more of the following. Where the primary voltage is V, each of the secondary voltage sources may generate a supplemental voltage lower than V which may be passed to the voltage-controlled oscillator. The supplemental voltage may be binary-weighted.

In another aspect, a frequency jittering circuit for varying a power supply switching frequency includes an oscillator for generating a switching frequency signal, the oscillator having a control input for varying the switching frequency; and means connected to the control input for varying the switching frequency.

Implementations of the invention include one or more of the following. The means for varying the frequency may include one or more current sources connected to the control input; and a counter connected to the output of the oscillator and to the one or more current sources. The oscillator may include a primary current source connected to the control input; and a differential switch connected to the primary current source. The differential switch may have first and second transistors connected to the primary current source; a third transistor connected to the first transistor; and a fourth transistor connected to the second transistor at a junction. A capacitor and a comparator may be connected to the junction. If the primary current source generates a current I, each of the current sources may generate a second current lower than the current I, further comprising a transistor connected to each current source connected to the counter. The means for varying the frequency may include one or more voltage sources connected to the control input; and a counter connected to the output of the oscillator and to the one or more voltage sources. The oscillator may include a primary voltage source connected to the control input; and a differential switch connected to the primary voltage source. The means for varying the frequency may include a capacitor; a current source adapted to charge the capacitor; and means for alternatingly charging and discharging the capacitor. One or more comparators may be connected to the capacitor and the means for alternatingly charging and discharging the capacitor.

In yet another aspect, a power supply includes a transformer, an oscillator for generating a signal having a frequency, the oscillator having a control input for varying the frequency of the signal, the oscillator including a primary current source connected to the control input; a differential switch connected to the primary current source; a capacitor connected to the differential switch; and a comparator connected to the differential switch. The power supply also includes a digital to analog converter connected to the control input, the analog to digital converter having one or more current sources, wherein the primary current source generates a current I and each of the current sources generates a current lower than I. A counter is connected to the output of the oscillator and to the current sources of the digital to analog converter. Further, a power transistor is connected to the primary winding of the transformer so that when the power transistor is modulated, a regulated power supply output is provided.

In another aspect, a power supply includes a transformer connected to an input voltage. The power supply includes an oscillator for generating a signal having a frequency, the oscillator having a control input for varying the frequency of the signal, the oscillator including: a primary current source connected to the control input; a differential switch connected to the primary current source; a capacitor connected to the differential switch; and a comparator connected to the differential switch. A circuit for varying the frequency is connected to the control input, the circuit having a capacitor; a current source adapted to charge and discharge the capacitor; one or more comparators connected to the capacitor to the current source for alternatingly charging and discharging the capacitor. Further, a power transistor is connected to the oscillator and to the primary winding. The power transistor modulates its output in providing a regulated power supply output.

Advantages of the invention include one or more of the following. The jittering operation smears the switching frequency of the power supply over a wide frequency range and thus spreads energy outside of the bandwidth measured by the EMI measurement equipment. By changing the oscillator frequency back and forth, the average noise measured by the EMI measurement equipment is reduced considerably.

Further, the invention provides the required jittering without requiring a large area on the regulator chip to implement a capacitor in a low frequency oscillator. Further, the invention minimizes effects caused by leakage current from transistors and capacitors associated with a low frequency oscillator. Thus, the jittering operation can be maintained even at high temperature which can increase current leakage.

Additionally, the invention reduces the need to add extra noise filtering components associated with the EMI filter. Therefore a compact and inexpensive power supply system can be built with minimal EMI emissions.

DESCRIPTION

Figure 1:
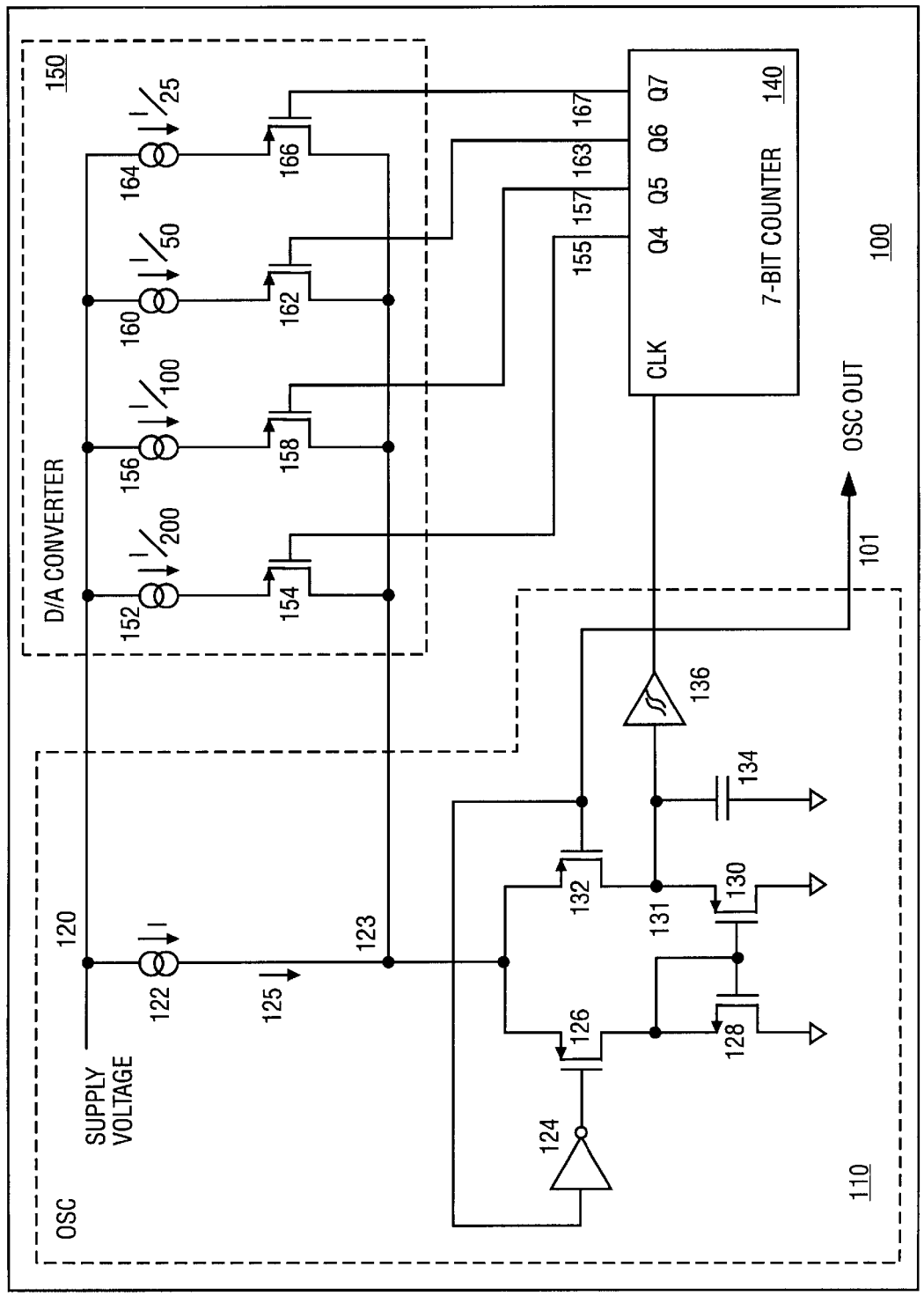
FIG. 1 is a schematic diagram of a digital frequency jittering device.

FIG. 1 shows a digital frequency jittering circuit 100. The digital frequency jittering circuit 100 has a primary oscillator 110 which provides a clock signal to a counter 140. The primary oscillator 110 typically operates between 100 kHz and 130 kHz. The counter 140 can be a seven bit counter. Each output of counter 140, when clocked by primary oscillator 110, represents a particular time interval. The outputs of the counter 140 are provided to a series of frequency jittering current sources 150. The outputs of the series of frequency jittering current sources 150 are presented to the primary oscillator 110 to vary its frequency, as will be described below.

Primary oscillator 110 contains a primary current source 122 which provides a primary current (denoted as I) to node 123. Current 125 to the node 123 is provided to the source of MOSFET transistors 126 and 132. The drain of MOSFET transistor 126 is connected to the drain of an n-channel MOSFET transistor 128. The source of transistor 128 is grounded, while the gate of the transistor 128 is connected to its drain. The gate of the transistor 128 is also connected to the gate of an n-channel MOSFET transistor 130. The source of the transistor 130 is grounded while the drain is connected to the drain of the MOSFET transistor 132 at a node 131. Transistors 126, 128, 130 and 132 form a differential switch. The output of comparator 136 is connected to the gate of the transistor 132 and to an inverter 124. The output of inverter 124 is connected to the gate of transistor 126. The comparator 136 has an input which is connected to node 131 and to a capacitor 134. In combination, the transistors 126, 128, 130 and 132, capacitor 134, inverter 124, current source 122 and comparator 136 form an oscillator. The output of the comparator 136 is provided as an oscillator output OSC_OUT 101 and is also used to drive the clock input of counter 140.

Counter 140 has a plurality of outputs Q1–Q3 (not shown) which are not used. The remaining outputs Q4–Q7 are connected to a digital-to-analog (D-to-A) converter 150, which may be implemented as a series of frequency jittering voltage sources or current sources. A Q4 output 155 is connected to the gate of a p-channel MOSFET transistor 154. A Q5 output 157 is connected to the gate of a p-channel MOSFET transistor 158. The Q6 output 163 is connected to the gate of a p-channel MOSFET transistor 162, and Q7 output 167 is connected to the gate of a p-channel MOSFET transistor 166. When D-to-A converter 150 is viewed as a plurality of current sources, the source of transistor 154 is connected to a jittering current source 152, which provides a current which is 1/200th of the current I generated by the current source 122. The source of MOSFET transistor 158 is connected to a current source 156 which provides a current that is 1/100th of the current I. The source of the MOSFET transistor 162 is connected to a jittering current source 160 which provides a current that is 1/50th of I. Finally, the source of the MOSFET transistor 166 is connected to a jittering current source 164 which provides a current that is 1/25th of the current I. The current sources 152, 156, 160 and 164 are binary-weighted, that is, the current source 164 provides twice the current provided by the current source 160, the current source 160 provides twice the current supplied by the current source 156 and the current source 156 provides twice the current provided by the current source 152.

Further, in one embodiment, the largest current source 164 may supply no more than 10% of the current I provided by the primary current source 122. The drain of transistors 154, 158, 162 and 166 are joined together such that the supplemental frequency jittering current sources of the D-to-A converter 150 can be provided to supplement the primary current source 122.

During operation, at every eight clock cycles, the counter output Q4 on line 155 changes state. Similarly, at every 16 clock cycles, the output Q5 on line 157 changes state and at every 32 clock cycles, the output Q6 on line 163 changes state, and every 64 clock cycles, the output Q7 on line 167 changes state. The entire counting cycle thereafter repeats itself.

Each time the output Q4 on line 155 is low, transistor 154 is turned on to inject current in the amount of I/200 to node 123 so that the total current 125 is 1.005I. Similarly, each time that the output Q5 on line 157 is low, transistor 158 is turned on to inject current in the amount of I/100 to node 123 so that the total current 125 is 1.01I. Further, each time that output Q6 on line 163 is low, transistor 162 is turned on to inject current in the amount of I/50 to node 123 so that the total current 125 is 1.02I. Finally, each time that the output Q7 on line 167 is low, the transistor 166 is turned on to inject current in the amount of I/25 to node 123 so that the total current 125 is 1.04I.

Additionally, when combinations of outputs Q4–Q7 are turned on, the outputs of the respective current sources 152, 156, 160 and 164 are added to the output of current source 122 to vary the frequency of the primary oscillator 110. In this manner, counter 140 drives a plurality of current sources to inject additional current to the main current source 122 such that the frequency of the primary oscillator 110 is varied.

Figure 2:
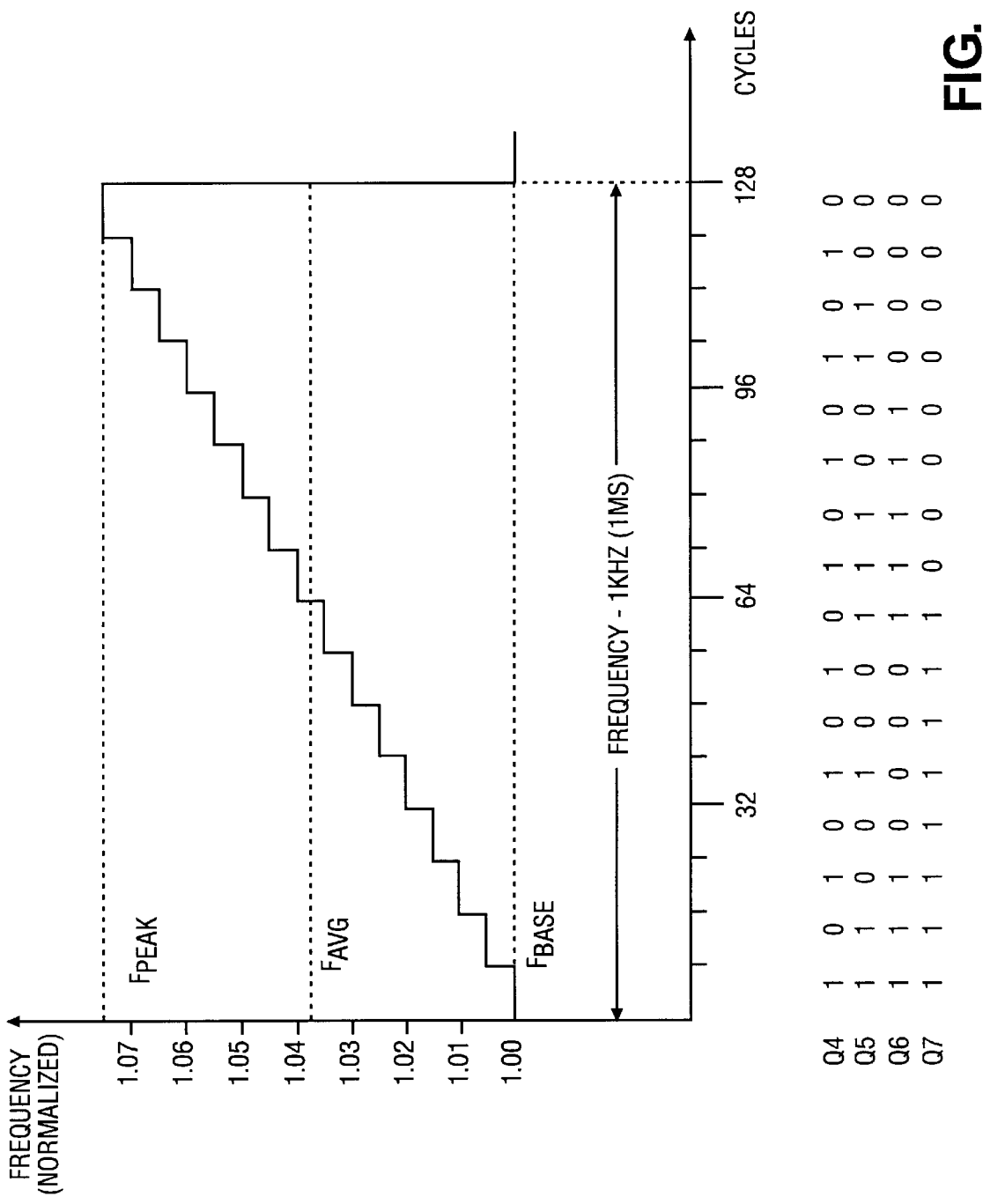
FIG. 2 is a plot illustrating the operation of the device of FIG. 1.

The jittering operation of the embodiment of FIG. 1 is further illustrated in a chart in FIG. 2. A normalized operating frequency is plotted on the y-axis while the counting cycle as shown by the counter outputs Q4–Q7 is plotted on the x-axis. As shown in FIG. 2, as the counter counts upward to the maximum count of 128, the peak switching frequency is achieved. This peak switching frequency is normalized to be about 1.075 times the base switching frequency. Further, on average, the switching frequency is between 1.03 and 1.04 times the base switching frequency. Thus, the embodiment of FIG. 1 deviates the switching frequency of the oscillator within a narrow range. This deviation reduces EMI noise by spreading the energy over a wider frequency range than the bandwidth measured by the EMI test equipment such that the noise measured by the EMI test equipment is reduced considerably.

Figure 3:
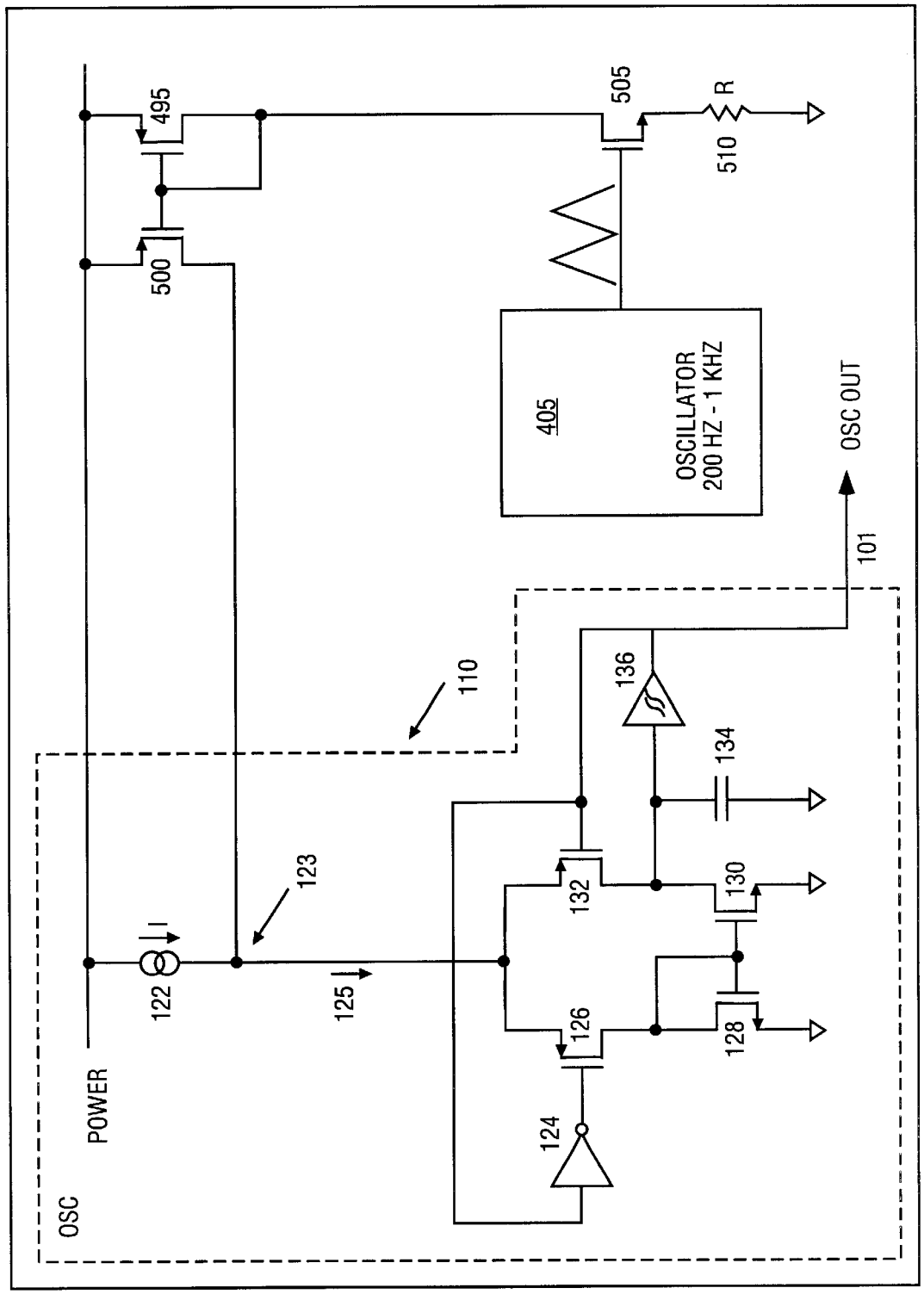
FIG. 3 is a schematic diagram of an analog frequency jittering device.

FIG. 3 shows an analog frequency jittering circuit. More details on the analog frequency jittering device are shown in co-pending U.S. application Ser. No. 09/080,774, entitled "OFFLINE CONVERTER WITH INTEGRATED SOFT START AND FREQUENCY JITTER," filed on May 18, 1998, the content of which is hereby incorporated by reference. In FIG. 3, the primary oscillator 110 provides an oscillator output on line OSC-OUT 101. An analog low frequency oscillator 405 is also provided. Primary oscillator 110 typically operates between a range of 30 to 300 kHz, while the low frequency oscillator 405 typically operates between a range of 5 Hz to 5 kHz. As discussed above, the switching frequency of the primary oscillator 110 is determined by the amount of current the primary oscillator uses to charge and discharge capacitor 134. The low frequency oscillator 405 varies this current within a narrow range to jitter the frequency of the primary oscillator 110.

The output of low frequency oscillator 405 is provided to a MOSFET transistor 505 connected to a resistor 510 and a current mirror including transistors 495 and 500. Transistor 500 is connected to node 123 so that extra current can be added to current source 122 feeding the primary oscillator. In this manner, the frequency of the primary oscillator 110 is shifted around a narrow range to reduce the EMI noise.

Figure 4:
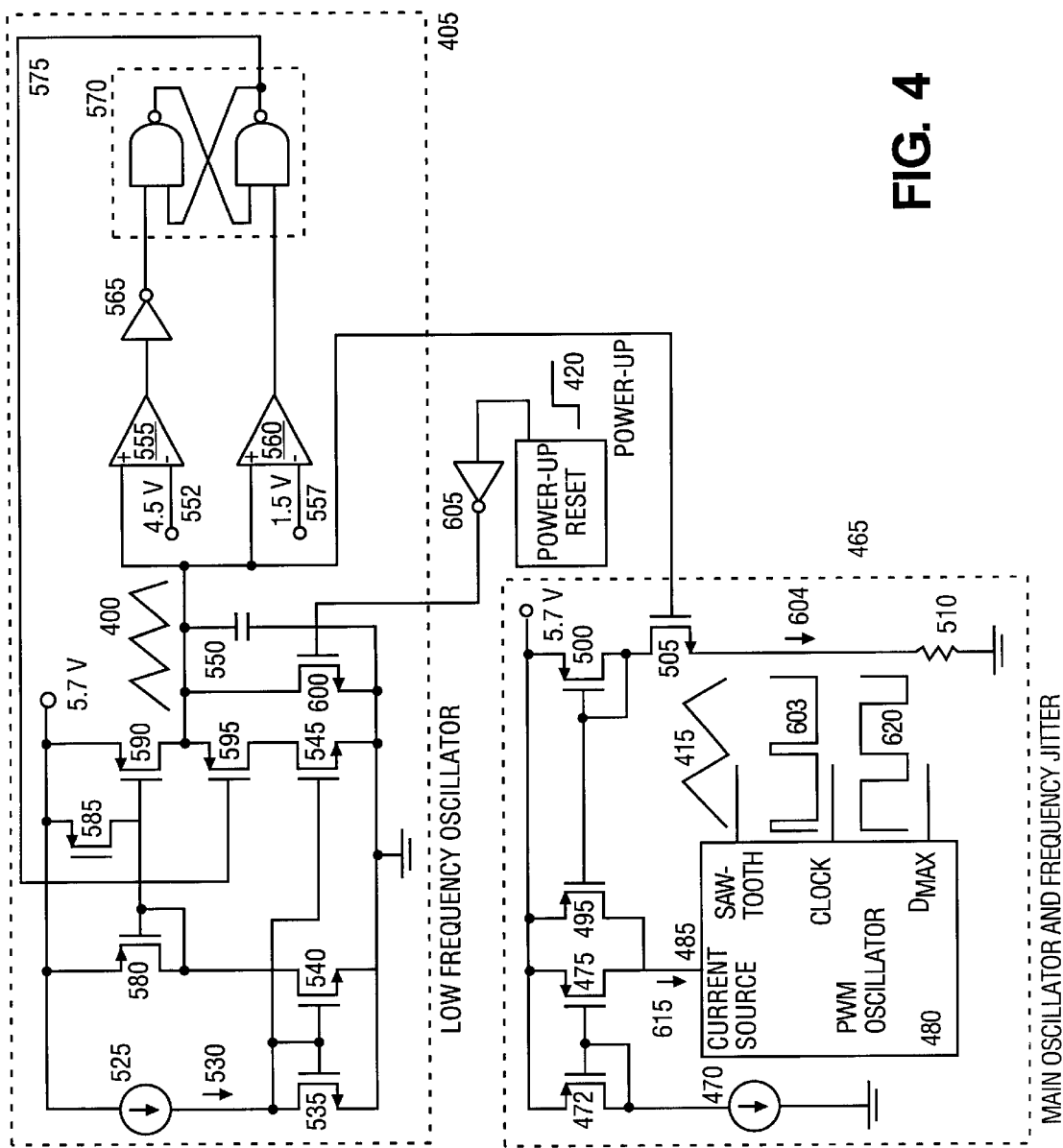
FIG. 4 is a schematic diagram of an implementation of the device of FIG. 3.

FIG. 4 shows a more detailed implementation of FIG. 3. As shown therein, main oscillator 465 has a current source 470 that is mirrored by current mirror transistors 472 and 475. Main oscillator drive current 615 is provided to current source input 485 of oscillator 480. The magnitude of the current input into current source input 485 determines the frequency of the oscillation signal 415 provided by oscillator 480. In order to vary the frequency of the oscillation signal 415, an additional current source 495 is provided within the main oscillator 465. The current source 495 is mirrored by current source mirror 500.

The current provided by current source 495 is varied as follows. Frequency variation signal 400 is provided to the gate of main oscillator transistor 505. As the magnitude of frequency variation signal 400 increases, so does the voltage at the source of main oscillator transistor 505 due to the increasing voltage at the gate of the transistor 505 and the relatively constant voltage drop between the gate and source of the transistor 505. As the voltage at the source of transistor 505 increases, so does the current 604 flowing through the resistor 510. The current flowing through the resistor 510 is the same as the current flowing through additional current source 500 which mirrors transistor 495.

Since the frequency variation signal 400 is a triangular waveform having a fixed period, as shown, the magnitude of the current input by additional current source mirror 500 will vary linearly with the magnitude of the rising and falling edges of the frequency variation signal 400. If the frequency variation signal 400 is a ramp signal, the frequency will linearly rise to a peak and then fall to its lowest value. In this way, the current 615 provided to current source input 485 of the oscillator 480 is varied in a known fixed range that allows for an easy and accurate frequency spread of the high frequency current. Further, the variance of the frequency is determined by the magnitude of the current provided by current source mirror 500, which is a function of the resistance of the resistor 510.

Frequency variation circuit 405 includes a current source 525 that produces a fixed magnitude current 530 that determines the magnitude of the frequency of the frequency variation signal 400. Although the current 530 has a fixed magnitude, the frequency variation signal can be generated utilizing a variable magnitude current. If such variable current is generated, the frequency spread is not fixed in time but varies with the magnitude of current 530. The fixed magnitude current 530 is fed into first transistor 535, mirrored by second transistor 540 and third transistor 545. The frequency variation signal 400 is generated by the charging and discharging of the capacitor 550. Frequency variation circuit capacitor 550 has a relatively low capacitance, which allows for integration into a monolithic chip in one embodiment of low frequency oscillator 405. The frequency variation signal 400 is provided to upper limit comparator 555 and lower limit comparator 560. The output of upper limit comparator 555 will be high when the magnitude of the frequency variation signal 400 exceeds the upper threshold voltage on line 552 which is about 4.5 volts. The output of lower limit comparator 560 will be low when the magnitude of frequency variation signal 400 drops below lower threshold voltage on line 557 which is about 1.5 volts. The output of upper limit comparator 555 is provided to the frequency variation circuit inverter 565 the output of which is provided to the reset input of frequency variation circuit latch 570. The set input of frequency variation circuit latch 570 receives the output of lower limit comparator 560.

In operation, the output of lower limit comparator 560 will be maintained high for the majority of each cycle of frequency variation signal 400 because the magnitude of frequency variation signal will be maintained between the upper threshold on line 552, 4.5 volts, and lower threshold on line 557, 1.5 volts. The output of upper limit comparator 555 will be low until the magnitude of frequency variation signal 400 exceeds upper level threshold on line 552. This means that the reset input will receive a high signal when the magnitude of the frequency variation signal 400 rises above the upper threshold signal on line 552.

The charge signal 575 output by frequency variation circuit latch 570 will be high until the frequency variation signal 400 exceeds the upper threshold limit signal on line 552. When the charge signal 575 is high, transistors 585 and 595 are turned off. By turning off transistors 585 and 595, current can flow into the capacitor 550, which steadily charges capacitor 550 and increases the magnitude of frequency variation signal 400. The current that flows into the capacitor 550 is derived from current source 525 because the current through transistor 590 is mirrored from transistor 580, which in turn is mirrored from transistor 535.

During power up, when power-up signal 420 is low, the output of inverter 605 is high, which turns on transistor 600, causing frequency variation signal 400 to go low. The frequency variation signal 400 starts from its lowest level to perform a soft start function during its first cycle of operation.

Figure 5:
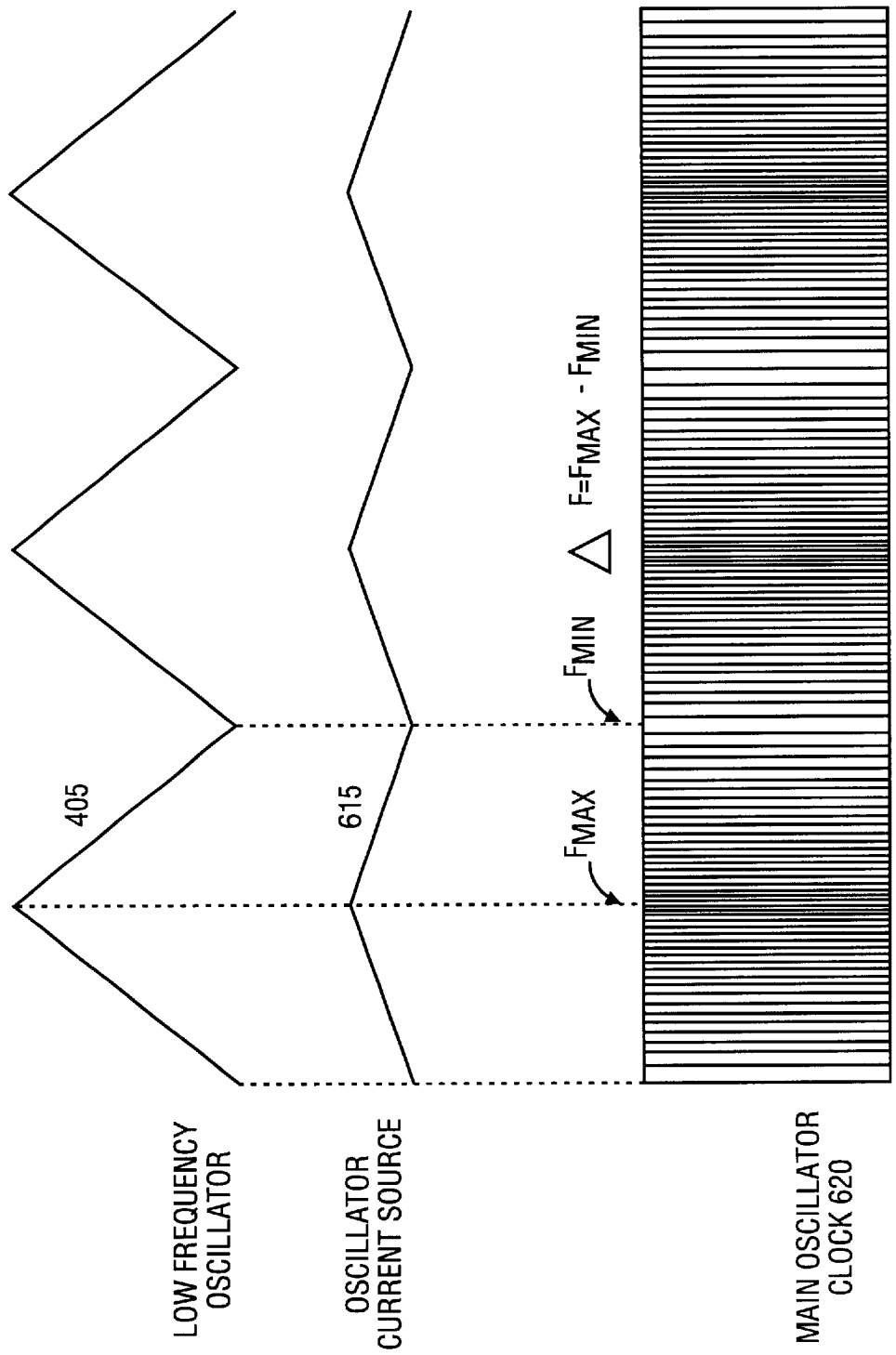
FIG. 5 is a timing diagram illustrating the operation of the frequency jitter device of FIG. 4.

Referring to FIGS. 4 and 5, FIG. 5 shows the operation of the analog frequency jittering device of FIG. 4. In FIG. 5, a frequency variation signal 405 is provided to the main oscillator 465. The magnitude of the current 615 is approximately the magnitude of the frequency variation signal 405, less the threshold voltage of transistor 505, and divided by the resistance of the resistor 510 plus the magnitude of the current produced by the current source 475. The current 615 varies with the magnitude of the frequency variation signal 405. The variation of the current 615 in turn varies the frequency of the oscillator clock.

Figure 6:
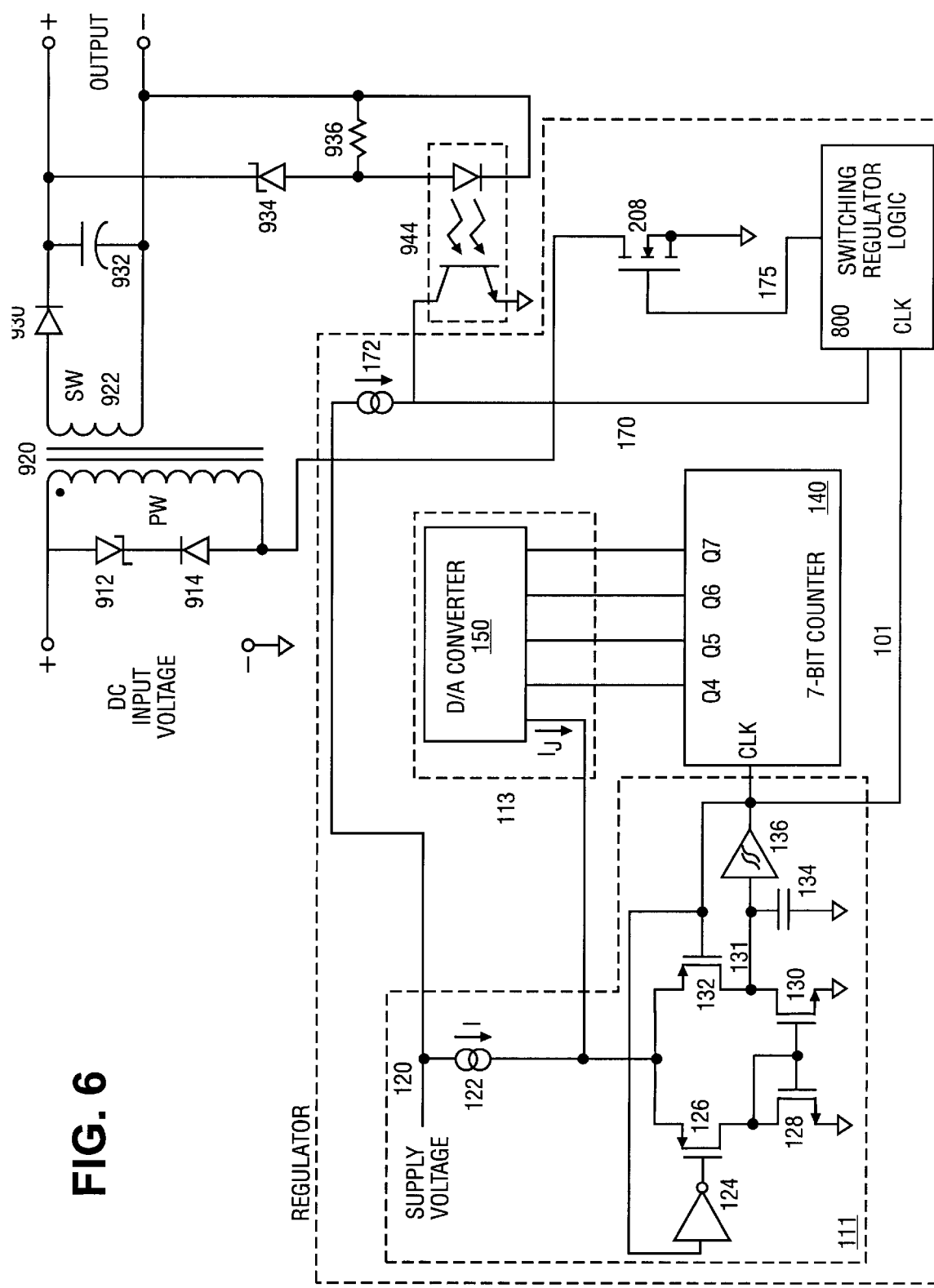
FIG. 6 is a schematic diagram of a switched mode power supply in accordance with the present invention.

Referring now to FIG. 6, a switched mode power supply is shown. Direct current (DC) input voltage is provided to a Zener diode 912 which is connected to a diode 914. The diodes 912–914 together are connected in series across a primary winding of a transformer 920. A secondary winding 922 is magnetically coupled to the primary winding of transformer 920. One terminal of the secondary winding 922 is connected to a diode 930, whose output is provided to a capacitor 932. The junction between diode 930 and capacitor 932 is the positive terminal of the regulated output. The other terminal of capacitor 932 is connected to a second terminal of the secondary winding and is the negative terminal of the regulated output. A Zener diode 934 is connected to the positive terminal of the regulated output. The other end of Zener diode 934 is connected to a first end of a light emitting diode in an opto-isolator 944. A second end of the light-emitting diode is connected to the negative terminal of the regulated output. A resistor 936 is connected between the negative terminal of the regulated output and the first end of the light-emitting diode of opto-isolator 944. The collector of the opto-isolator 944 is connected to current source 172. The output of current source 172 is provided to the switching regulator logic 800.

Connected to the second primary winding terminal is the power transistor 208. Power transistor 208 is driven by the switching regulator logic 800. Switching regulator logic 800 receives a clock signal 101 from an oscillator 111. A counter 140 also receives the clock signal 101 from the primary oscillator 111. The outputs of counter 140 are provided to D-to-A converter 150, which is connected to oscillator 111 for jittering the oscillation frequency. Alternatively, in lieu of counter 140 and a D-to-A converter 150, an analog low frequency jittering oscillator may be used.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A digital frequency jittering circuit for varying the switching frequency of a power supply, comprising:
    an oscillator for generating a signal having a switching frequency, the oscillator having a control input for varying the switching frequency;
    a digital to analog converter coupled to the control input for varying the switching frequency; and
    a counter coupled to the output of the oscillator and to the digital to analog converter, the counter causing the digital to analog converter to adjust the control input and to vary the switching frequency.

2. The circuit of claim 1, wherein the oscillator further comprises a primary current source coupled to the oscillator control input.

3. The circuit of claim 2, further comprising a differential switch, including:
    first and second transistors coupled to the primary current source;
    a third transistor coupled to the first transistor; and
    a fourth transistor coupled to the second transistor at a junction.

4. The circuit of claim 3, further comprising a capacitor coupled to the junction.

5. The circuit of claim 3, further comprising one or more comparators coupled to the junction.

6. The circuit of claim 2, wherein the digital to analog converter has one or more secondary current sources.

7. The circuit of claim 6, further comprising a transistor coupled between each secondary current source and the counter.

8. The circuit of claim 6, wherein the primary current source generates a current I and each of the secondary current sources generates a current lower than I.

9. The circuit of claim 8, wherein the secondary current sources generate binary weighted currents.

10. The circuit of claim 8, wherein the largest secondary current source generates a current which is less than about 0.1 of I.

11. A method for generating a switching frequency in a power conversion system, comprising:
    generating a primary current;
    cycling one or more secondary current sources to generate a secondary current which varies over time; and
    combining the secondary current with the primary current to be received at a control input of an oscillator for generating a switching frequency which is varied over time.

12. The method of claim 11 further comprising the step of clocking a counter with the output of the oscillator.

13. The method of claim 11 wherein the primary current is generated by a current source.

14. The method of claim 11 wherein the primary current is I and each of the secondary current sources generates a supplemental current lower than I, and further comprising passing the supplemental current to the oscillator control input.

15. The method of claim 14 further comprising binary-weighting the supplemental current.

16. The method of claim 14 wherein the largest supplemental current is less than approximately 0.1 of I.

17. A method for generating a switching frequency in a power conversion system, comprising:
    generating a primary voltage;
    cycling one or more secondary voltage sources to generate a secondary voltage which varies over time; and
    combining the secondary voltage with the primary voltage to be received at a control input of a voltage-controlled oscillator for generating a switching frequency which is varied over time.

18. The method of claim 17 further comprising clocking a counter with the output of the oscillator.

19. The method of claim 17 wherein the primary voltage is V and each of the secondary voltage sources generates a supplemental voltage lower than V, further comprising passing the supplemental voltage to the voltage-controlled oscillator.

20. The method of claim 19, wherein the supplemental voltage is binary-weighted.

21. A frequency jittering circuit for varying a power supply switching frequency, comprising:
    an oscillator for generating a signal having a switching frequency, the oscillator having a control input for varying the switching frequency; and
    means coupled to the control input for varying the switching frequency, including:
        one or more current sources coupled to the control input; and
        a counter coupled to the output of the oscillator and to the one or more current sources.

22. The circuit of claim 21 wherein the oscillator further comprises:
    a primary current source coupled to the control input; and
    a differential switch coupled to the primary source.

23. The circuit of claim 22 wherein the oscillator further comprises:
    first and second transistors coupled to the primary current source;
    a third transistor coupled to the first transistor; and
    a fourth transistor coupled to the second transistor at a junction.

24. The circuit of claim 22 further comprising a capacitor and a comparator coupled to the junction.

25. The circuit of claim 22 wherein the primary current source generates a current I and each of said one or more current sources generates a current lower than I.

26. The circuit of claim 22 wherein the primary current source generates a current I and each of said one or more current sources generates a second current lower than the current I, further comprising a transistor coupled to each current source connected to the counter.

27. The circuit of claim 21 further comprising a transistor coupled to each current source and to the counter.

28. The circuit of claim 21 wherein the oscillator further comprises:
    a primary voltage source coupled to the control input; and
    a differential switch coupled to the primary voltage source.

29. The circuit of claim 21 wherein the means for varying the frequency further comprises:
    a capacitor; and
    a current source adapted to charge and discharge the capacitor.

30. The circuit of claim 29 further comprising:
    one or more comparators coupled to the capacitor; and
    means coupled to the capacitor for alternatingly charging and discharging the capacitor.

31. A power supply having a transformer coupled to an input voltage, the transformer having a primary winding, the power supply comprising:
    an oscillator for generating a signal having a frequency, the oscillator having a control input for varying the frequency of the signal, the oscillator including:
        a primary current source coupled to the control input;
        a differential switch coupled to the primary current source;
        a capacitor coupled to the differential switch; and
        a comparator coupled to the differential switch;
    a digital to analog converter coupled to the control input, the digital to analog converter having one or more current sources, wherein the primary current source generates a current I and each of said one or more current sources generates a current lower that I;
    a counter coupled to the output of the oscillator and to the current sources of the digital to analog converter; and
    a power transistor coupled to the oscillator and to one terminal of the primary winding, the power transistor modulating its output in providing a regulated power supply output.

32. A power supply having a transformer coupled to an input voltage, the transformer having a primary winding, the power supply comprising:
    an oscillator for generating a signal having a frequency, the oscillator having a control input for varying the frequency of the signal, the oscillator including:
        a primary current source coupled to the control input;
        a differential switch coupled to the primary current source;

a capacitor coupled to the differential switch; and
a comparator coupled to the differential switch
a circuit for varying the frequency, the circuit coupled to the control input, including:
  a capacitor;
  a current source adapted to charge and discharge the capacitor;
  one or more comparators coupled to the capacitor and coupled to the current source for alternatingly charging and discharging the capacitor; and a power transistor coupled to the oscillator and to one terminal of the primary winding, the power transistor modulating its output in providing a regulated power supply output.

* * * * *

UNITED STATES PATENT AND TRADEMARK OFFICE
CERTIFICATE OF CORRECTION

PATENT NO. : 6,249,876 B1
DATED : June 19, 2001
INVENTOR(S) : Balakrishnan et al.

It is certified that error appears in the above-identified patent and that said Letters Patent is hereby corrected as shown below:

Column 10,
Line 2, please insert -- current -- after "primary".
Line 3, please delete "wherein the oscillator further" and insert -- wherein the differential switch further --.

Signed and Sealed this

Nineteenth Day of February, 2002

Attest:

JAMES E. ROGAN
*Attesting Officer*   *Director of the United States Patent and Trademark Office*